(12) United States Patent
Gude

(10) Patent No.: US 11,355,455 B2
(45) Date of Patent: Jun. 7, 2022

(54) MULTI-DIE CHIP

(71) Applicant: Michael Gude, Kerpen (DE)

(72) Inventor: Michael Gude, Kerpen (DE)

(*) Notice: Subject to any disclaimer, the term of this patent is extended or adjusted under 35 U.S.C. 154(b) by 44 days.

(21) Appl. No.: 16/873,973

(22) Filed: Sep. 2, 2020

(65) Prior Publication Data

US 2021/0074651 A1 Mar. 11, 2021

(30) Foreign Application Priority Data

Sep. 5, 2019 (DE) .......................... 102019006294.9

(51) Int. Cl.
*H01L 23/00* (2006.01)
*H01L 23/528* (2006.01)

(52) U.S. Cl.
CPC .......... *H01L 23/564* (2013.01); *H01L 23/528* (2013.01)

(58) Field of Classification Search
CPC ... H01L 25/0655; H01L 25/50; H01L 27/118; H01L 27/0688; H01L 23/564; H01L 23/528; H01L 23/535; H01L 23/52; H01L 23/481
See application file for complete search history.

(56) References Cited

U.S. PATENT DOCUMENTS

| | | | |
|---|---|---|---|
| 8,796,740 B1* | 8/2014 | Landis | H01L 21/82 257/210 |
| 2002/0004932 A1* | 1/2002 | Shau | H01L 27/0207 326/101 |
| 2016/0172263 A1* | 6/2016 | Shi | H01L 24/05 257/620 |
| 2016/0322434 A1* | 11/2016 | Ghosh | H01L 27/3218 |
| 2017/0053832 A1* | 2/2017 | Wan | H01L 22/14 |

* cited by examiner

*Primary Examiner* — Galina G Yushina

(57) ABSTRACT

The task of the present invention is to realize chips of different sizes, in particular FPGAs, without the need for ever new production mask sets. In the conventional way, a single die can be used or almost any number of dies from one wafer.

According to the invention, only one lithography mask set is used for chip production and multi-die chips of different sizes with 1 . . . n single dies are separated from a wafer. The single dies are connected by the scribeline between the dies. According to the patent claims, various precautions must be taken to ensure that the dies are reliably connected and that no problems occur when separating the multi-die chips.

5 Claims, 3 Drawing Sheets

MULTI-DIE CHIP

CROSS REFERENCE TO RELATED APPLICATIONS

U.S. Pat. No. 9,147,611 B1
US 2015/0171079 A1
US 2002/0004932 A1

TECHNICAL FIELD

The present application relates generally to the field of integrated semiconductor manufacturing.

BACKGROUND OF THE INVENTION

Electronic components as integrated circuits containing several dies, i.e. several single chips, have been state of the art for several years. Here, several chip dies are wired by different connection techniques in such a way that e.g. multi-chip modules or multi-chip arrangements can be realized in a common chip or module housing. Common to these techniques is that individual chips, usually of different technologies, are used, separated from the respective production wafer.

For certain types of chips, e.g. FPGAs, chips of different sizes with essentially repeating structures are to be realized. According to the state of the art, this requires a separate production mask set for each chip size, which is extremely expensive especially in today's nanometer technologies.

According to the state of the art it is described in the US patent (U.S. Pat. No. 9,147,611 B1) and in the US patent application (US 2015/0171079 A1) that from one wafer different sized, interconnected arrangements of several single dies can be produced with only one production mask set.

The US patent application (US 2002/0004932 A1) additionally shows how the seal ring can be tunneled under at the edge of a single die.

The task of the present invention is to realize chips of different sizes, in particular FPGAs, without the need for ever new production mask sets and to connect them via the so-called scribeline, i.e. the scribing trench between the chips. In the conventional way, a single die can be used or an almost arbitrary number of dies from a wafer, which then realize a high number of connections between the individual dies.

DETAILED DESCRIPTION

The task of the present invention is to realize chips of different sizes, in particular FPGAs, without the need for ever new production mask sets and to connect them via the so-called scribeline, i.e. the scribing trench between the chips. In the conventional way, a single die can be used or an almost arbitrary number of dies from a wafer, which then realize a high number of connections between the individual dies.

This task is solved by the object according to claim 1.

According to claim 1, the characteristic element of the invention is that only one lithography mask set is used for chip fabrication and multi-die chips of different sizes with 1 . . . n single dies are separated from a wafer.

In the following, the description of the invention and the claims only deal with the case that n>1.

Thus, at least two dies from one wafer are used which were not separated individually. In this case there are usually no electrical connections between the dies. These can be made e.g. by bonding wires between the chips.

The disadvantage of these connections with bonding wires is that at least one input and one output buffer is used, which leads to considerable signal delays when passing from one chip to the other.

According to the further part of claim 1, it is therefore proposed to connect the dies directly in the wafer, i.e. without 10-buffer.

However, since the invention is intended to make it possible to realize many different sized multi-die chips starting from a single die, it must be ensured that the dies can be separated and thus the direct connections in the wafer can be cut without any problems.

These are usually separated by scoring or milling and subsequent breaking at these predetermined breaking edges.

In this case, various problems arise:

a) In the area of breakage, destruction occurs at the die edge, which in extreme cases can lead to different connection levels of the chip being short-circuited.

b) Due to the separation of the tracks at the break edge, the inputs to which these tracks are connected float. This can lead to unnecessarily high current consumption of the chip.

Since normally dies on the wafer at the break edge have no conductive connections, problem a) does not occur with wafers not manufactured according to the invention. According to the further part of claim 1, the problem can be avoided if only one connection level is used at the break edge. This prevents a short circuit with another connection level.

Figure 1:
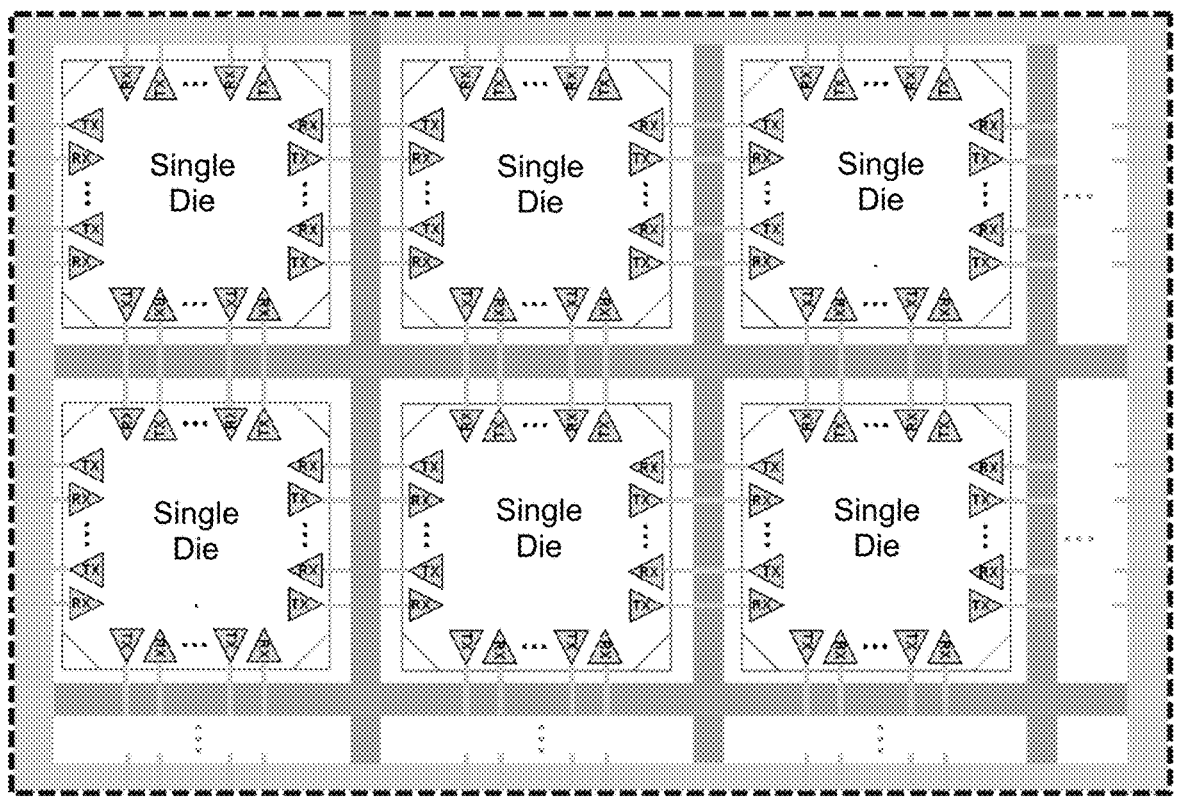
FIG. 1: Single dies with connections in a reticle
The drawing shows an example embodiment of the connection of individual Dies with each other. In an arrangement according to claim 5 the reticle has the size of X dies times Y dies.
Figure 2:
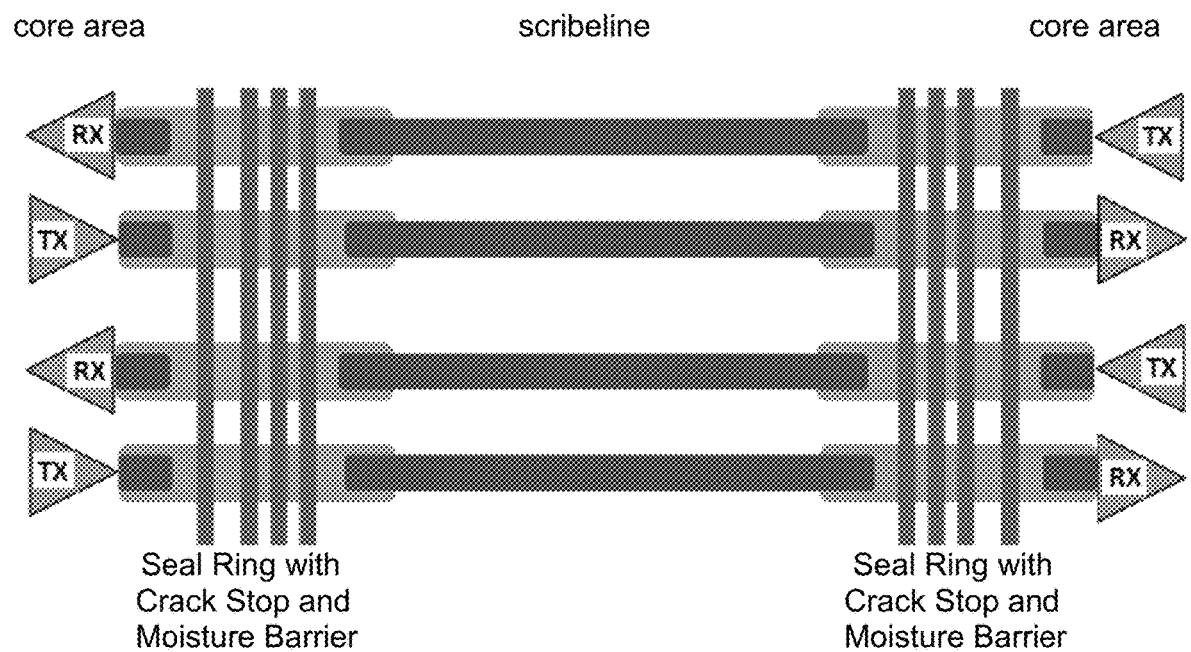
FIG. 2: Die-to-Die connections with tunneling of the metallic barrier
The drawing shows an example embodiment of a die-to-die connection which is used to bridge two barriers (seal ring) and the intersection line (scribeline) between the dies. The long connections in the scribeline are the highly doped connections according to claim 1.
Figure 3:
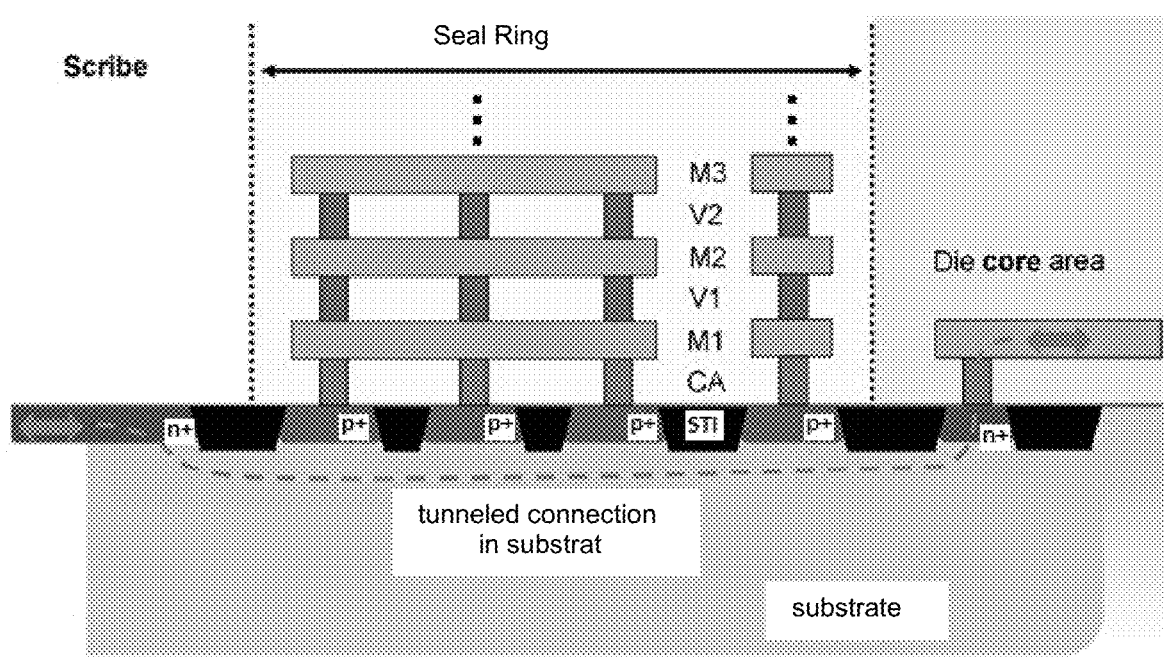
FIG. 3: Substrate connection under seal ring
The drawing shows an example embodiment of a cut section through the wafer at the edge of a die. Here it is shown how the seal ring is tunneled under according to claim 1.

In addition, the problem can also be eliminated by not using any continuous metallic connections between the dies. According to the further parts of claim 1, a connection lying in the semiconductor substrate is suggested for this purpose. Thus, the metallic barrier is electrically tunneled under. This sophisticated design is shown in FIG. 3. Similarly, the connection in the scribeline between the dies can be realized by a low-resistance, highly doped connection in the semiconductor substrate. This sophisticated design is shown in FIG. 2.

Since electrical connections are cut when the dies are disconnected, which then "hang in the air", a floating of the cut inputs is avoided by means of electronic switches and/or bus holders.

Alternatively or in addition to this, a short circuit of outputs at the break edge is prevented by electronic switches that switch off the signals of the cut connections.

The proposed technique is particularly efficient if, according to claims 2 and 3, connections are also made across so-called reticle boundaries. This makes it possible to cut arbitrarily large arrangements of dies out of a wafer, which are all interconnected.

The techniques listed so far can also be applied to wafers with different chips (e.g. Multiproject Wafer). According to claim 4 they are especially useful for wafers with similar dies.

Since dies can be separated from a wafer by straight cuts according to the state of the art, a rectangular arrangement of dies in a multi-die chip is advantageous. This results in the following typical arrangements:

(<number in X-direction> x <number in Y-direction>:<number of dies in total>)

1×1: 1
1×2: 2
1×3: 3
2×2: 4
2×3: 6
2×4: 8
3×3: 9
3×4: 12
3×5: 15
3×6: 18
4×4: 16
4×5: 20
4×6: 24
4×8: 32
5×5: 25
5×6: 30
6×6: 36
6×8: 48
8×8: 64

According to claim 5, it is also possible to arrange dies of different sizes on the wafer and connect them accordingly. It is particularly useful here if these single dies are a fraction or multiple of the size of the other dies.

What is claimed is:

1. A multi-chip,
   where only one set of lithography mask is used for manufacturing multi-die chips of different sizes, each chip separated from a wafer comprises 1 . . . n single dies, and
   where electrical connections are present between at least two individual dies of a multi-die chip without use of Input/Output buffers, and
   where adjacent individual dies of the multi-die chip are connected by an electrically conductive layer passing through a wafer substrate surface area that otherwise is used as a dividing line, the electrically conductive layer tunnels under metallic protective barriers located at edges of the adjacent individual dies and is realized as a low-resistance high doped substrate connection, and
   where stripes of low-resistance high doped substrate connections between various adjacent individual dies of the multi-die chip are realized in surfaces of multiple dividing lines.

2. The multi-die chip according to claim 1 characterized in that adjacent dies, one located within a reticle and another—outside the reticle, are connected through the substrate, the same way as adjacent dies within the reticle.

3. The multi-die chip according to claim 1 characterized in that each single die of the wafer is connected to adjacent dies and thus any number of multi-die chip arrays can be separated out.

4. The multi-die chip according to claim 1 characterized in that the multi-die chip consists of a rectangular arrangement of several identical single dies.

5. The multi-die chip according to claim 1 characterized in that the multi-die chip consists of single dies of different sizes.

* * * * *